United States Patent [19]

Bronshtein et al.

[11] 4,141,025

[45] Feb. 20, 1979

[54] SEMICONDUCTOR STRUCTURE SENSITIVE TO PRESSURE

[75] Inventors: Izidor K. Bronshtein; Vadim N. Maslov; Elena M. Kistova; Oleg E. Korobov; Natalya I. Lukicheva, all of Moscow; Viktor V. Myasoedov, Podolsk; Jury V. Sokurenko, Moscow; Evgeny V. Sinitsyn, Moscow; Elena S. Jurova, Moscow, all of U.S.S.R.

[73] Assignee: Gosudarstvenny Nauchno-Issle-Dovatelsky I Proektny Institut Redkometallicheskoi Promyshlennosti "GIREDMET", U.S.S.R.

[21] Appl. No.: 781,046

[22] Filed: Mar. 24, 1977

[51] Int. Cl.[2] .................. H01L 29/84; H01L 29/96; H01L 29/161
[52] U.S. Cl. .................................. 357/26; 357/16; 357/61
[58] Field of Search .................. 357/26, 61, 16; 73/88.5 SD

[56] References Cited

U.S. PATENT DOCUMENTS

| | | | |
|---|---|---|---|
| 3,200,354 | 8/1965 | White | 357/26 |
| 3,270,562 | 9/1966 | Ehrenreich | 73/88 SD |
| 3,369,132 | 2/1968 | Fang et al. | 357/26 |
| 3,387,230 | 6/1968 | Marinace | 357/26 |
| 3,578,864 | 5/1971 | Ross | 357/26 |
| 3,624,465 | 11/1971 | Moore | 357/26 |
| 3,740,689 | 6/1973 | Yamashita | 73/88.5 SD |
| 3,805,601 | 4/1974 | Jeffers | 73/88.5 SD |

*Primary Examiner*—Andrew J. James
*Attorney, Agent, or Firm*—Robert E. Burns; Emmanuel J. Lobato; Bruce L. Adams

[57] ABSTRACT

A semiconductor pressure sensing device comprises a solid made as a $AB_{1-x}C_x$ semiconductor structure composed of two semiconductor materials AB and AC and a means for measuring variations of electrical resistance of the solid in response to changes of the pressure applied thereto, which is electrically connected to the solid, the semiconductor structure having a first group of layers possessing one value of x and a second group of layers possessing a second value of x and alternating with the layers of the first group.

6 Claims, 5 Drawing Figures

SEMICONDUCTOR STRUCTURE SENSITIVE TO PRESSURE

BACKGROUND OF THE INVENTION

The invention relates to devices for measuring pressure in liquids and gases and, in particular, to a semiconductor pressure sensing device.

The disclosed semiconductor pressure sensing device can be employed to measure pressure in drill holes and pipelines, in hydraulic and pneumatic aircraft systems, in internal combustion engines, in hydraulic agricultural mechanisms, as well as to measure superhigh pressures in laboratory conditions.

The present invention can be, besides, used for measuring the force in weighing heavy loads (railway cars, mine cars), as well as in forge and pressing equipment to control operational efforts.

There is known an effect of resistance changes in semiconductor materials in response to a hydrostatic pressure of the environment: air, gas, liquid.

This phenomenon is also known and employed to manufacture pressure gauges and, particularly, there is known a semiconductor pressure sensing device based on the n-type monocrystalline gallium antimonide, which is provided with two contacts and changes of the difference in signals between these contacts serves as an indication of the variation of the pressure.

The gallium antimonide conduction band possesses two minimums which relative energy location changes in response to the hydrostatic pressure, which results in the change of the electrical resistance of the pressure sensing device.

But the minimums of the conduction band in gallium antimonide move in response to pressure in one direction along the energy scale and the sensitivity coefficient of the gauge to pressure is low (less than $10^{-4}$ bar$^{-1}$), the operational pressure range of such gauges based on gallium antimonide being limited to a range of from 0 to 10,000 bars.

The temperature stability of these gauges is insufficient: the temperature factor of sensitivity variation is too high and reaches 0.5% . deg$^{-1}$.

There is known another pressure gauge comprising a solid based on $AB_{1-x}C_x$ solid solution, composed of two semiconductor materials AB and AC of which the first has a direct forbidden band and the second has an indirect forbidden band and each of these materials has direct and indirect minimums of the conduction band, whereas the value of x which is the mole fraction of the AC material in the $AB_{1-x}C_x$ solid solution is selected so as to bring close the energy of the direct and indirect minimums of the conduction band of the $AB_{1-x}C_x$ solid solution. The pressure gauge also comprises a means for measuring changes in electric resistance of the solid in response to the applied pressure, which is electrically coupled to the solid.

The known pressure gauge is made on the basis of the $GaAs_{1-x}P_x$ solid solution comprising gallium arsenide and gallium phosphide in a specified mole ratio.

The value of x in the $GaAs_{1-x}P_x$ solid solution is selected depending on the range of pressures to be measured.

It is possible to produce gauges for measuring high or low pressures within a range of from 0 to 60,000 bars by selecting solid solutions with different values of x.

Sensitivity of such gauges to pressure is higher as compared to the monocrystalline gallium antimonide based gauges and lies within a range of from $2.00^{-4}$ to $4.10^{-4}$ bar$^{-1}$ throughout the pressure range.

This can be accounted for by the fact that the minimums of the conduction band move in response to pressure in opposite directions of the energy scale.

However, a serious drawback of the known pressure gauge consists in the low temperature stability of its parameters, which is due to the change of the ratio between the thermal energy of the electron and the energy gap between the minima of the conduction band for the $GaAs_{1-x}P_x$ solid solution.

Thus, according to the cited exterimental data on the dependence of the sensitivity factor upon the x value ratio for three temperatures +25° C., −27° C. and +90° C. the sensitivity to pressure of the gauge based on the $GaAs_{0.65}P_{0.35}$ solid solution changes by nearly 20% from $3.10^{-4}$ bar$^{-4}$ at −27° C. to $2.5.10^{-4}$ bars$^{-1}$ at +90° C., that is the temperature factor of sensitivity variation reaches almost 0.15% deg.$^{-1}$, which is a considerably large figure. For the pressure gauge based on the $GaAs_{0.6}P_{0.4}$ sensitivity to pressure changes from $3.6.10^{-4}$ bar$^{-1}$ at +25° C. to $2.10^{-4}$ bar$^{-1}$ at +90° C., that is the temperature factor of sensitivity variation is equal to 0.7% . deg.$^{-1}$.

This significantly limits technical employment of such pressure gauges when the difference in the measured temperature varies widely.

SUMMARY OF THE INVENTION

It is an object of this invention to reduce errors in pressure measurements during uniform compression of a liquid or a gas.

Another object of this invention consists in providing a semiconductor pressure sensing device characterized by an increased temperature stability of the pressure sensitivity coefficient.

Besides, yet another object of the invention consists in providing a pressure sensing device ensuring measurement of hydrostatic pressure within a wide range of operational temperatures.

Still another object of this invention consists in providing a pressure sensing device possessing a high temperature stability of electrical resistance within the operational range.

These and other objects are achieved by a semiconductor pressure sensing device that comprises a solid based on the $AB_{1-x}C_x$ solid solution composed of two semiconductor materials AB and AC of which the first possesses a direct forbidden band and the second an indirect forbidden band and each has a direct and an indirect energy minimums of the conduction band, whereas the value of x which the mole fraction of the AC material in the $AB_{1-x}C_x$ solid solution is selected so that to bring close the energy of the direct and indirect minimums of the conduction band of the $AB_{1-x}C_x$ solid solution, as well as a means for measuring variations of electrical resistance of the solid in response to the applied pressure and, according to the invention, the solid is a semiconductor structure comprising two groups of alternating layers with different values of x, of which each group has at least one layer and equal value of x in a group, the range of x variation from the minimum to the maximum value within the semiconductor structure and the ratio of the volumes of the layers from different groups are selected so as to compensate the reduction of the sensitivity to the applied pressure in response to temperature variations in the layers of the first group by its increase in the layers of the second group.

It is advisable that a semiconductor structure be used with a constant value of x throughout the thickness of each layer.

It is also advisable that a semiconductor structure be used, wherein the x value in each layer changes throughout the thickness of the layer from its one boundary to the other according to a principle expressed by a sinusoidal section.

It is useful that the layers of a semiconductor structure be doped with a donor impurity with shallow energy levels to the free carriers concentration sufficient for degeneracy of the electron gas in the semiconductor structure.

It proved to be useful that a solid be made as a $GaAs_{1-x}P_x$ semiconductor structure, where x is selected from a range of values from 0.2 to 0.4, the difference between the maximum and minimum values of x in the structure is selected in a range of from 0.02 to 0.2, whereas the ratio of the total volume of layers of the first group to the total volume of layers of the second group is selected from a range of from 1 to 10 and the thickness of each layer is selected from a range of from 200 Å to 3,000 Å.

Besides, it is advisable that the layers of the $GaAs_{1-x}P_x$ semiconductor structure be doped with a donor impurity with shallow energy levels to the concentration of free carriers selected from a range of from $2.10^{18}$ to $7.10^{18}$ cm$^{-3}$.

The proposed pressure sensing device possesses very high temperature stability of the pressure sensitivity coefficient.

BRIEF DESCRIPTION OF THE DRAWINGS

The invention will now be described in greater detail with reference to specific embodiments thereof, taken in conjunction with the accompanying drawings, wherein.

DESCRIPTION OF THE PREFERRED EMBODIMENTS

Figure 1:
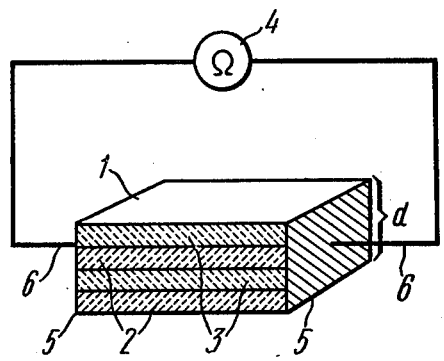
FIG. 1 shows a schematic of a semiconductor pressure sensing device, according to the invention.

Let us consider the semiconductor pressure sensing device schematically shown in FIG. 1.

A semiconductor pressure sensing device comprises a solid 1 based on the $AB_{1-x}C_x$ solid solution composed of two semiconductor materials AB and AC of which the first material possesses a direct forbidden band and the second material possesses an indirect forbidden band. Each of these materials has a direct and an indirect energy minimums of the conduction band.

The $AB_{1-x}C_x$ solid solution is a semiconductor structure composed of two groups of alternating layers 2 and 3.

The first group has at least one layer 2 possessing a first mean value of x, whereas the second group has at least one layer 3 possessing a second mean value of x.

Semiconductor structures are made on the basis of solid solutions comprising materials $A^{III}B^V$. Examples of such structures are $GaAs_{1-x}P_x$, $AsGa_{1-x}Al_x$, $PJn_{1-x}Ga_x$. In this case GaAs and JnP possess direct forbidden bands, whereas GaP and AlAs possess indirect forbidden bands.

The value of x, which determines the mole fraction of the AB material in the $AB_{1-x}C_x$ solid solution is selected so as to bring close the energy of the direct and indirect minimums of the conduction band of the $AB_{1-x}C_x$ solid solution.

The range of x variation from the minimum to the maximum value in the $AB_{1-x}C_x$ semiconductor structure and the ratio between the volumes of the layers 2 and 3 of the different groups are selected so as to compensate the reduction in sensitivity to the applied pressure in resonse to temperature variation in the layers 2 of the first group by increased temperature sensitivity in the layers 3 of the second group.

A means for measuring variations of electrical resistance of the solid 1 in response to the applied pressure is made as an ohmmeter 4.

Ohmic contacts 5 coupled to the side surface of the solid 1 with a thickness d are electrically connected by means of leads 6 to the input of the ohmmeter 4.

The layers 2 and 3 of the semiconductor structure may be doped by a donor impurity with shallow energy levels to the concentration of free carriers sufficient for degeneracy of the electron gas in the semiconductor structure.

Tellurium, selenium, tin can be used as such impurities in solid solutions comprising $A^{III}B^V$ materials.

Figure 2:
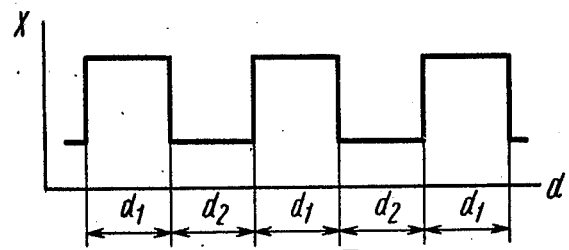
FIG. 2 shows a graph of x variation from one layer to another layer of the structure, throughout the thickness of the solid, according to the invention.

The value of x in each layer 2 or 3 can be constant throughout the thickness of the layer 2 or 3 or vary in each layer 2 or 3 throughout the thickness of the layer 2 or 3 from one its boundary to the other, Referring to FIG. 2, the value of x varies from the layer 2 to the layer 3 of the structure throughout the thickness d of the solid 1 (FIG. 1).

Here (FIG. 2) $d_1$ is a thickness of each layer 2 of the first group of layers, whereas $d_2$ is a thickness of each layer 3 of the second group.

Throughout the thickness $d_1$ of the layer 2 (FIG. 1) x has a first constant value, whereas throughout the thickness $d_2$ (FIG. 2) of the layer 3 x has a second constant value.

Figure 3:
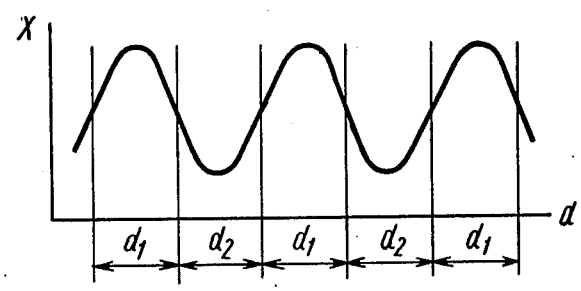
FIG. 3 shows a graph of another principle of x variation from one layer to another layer of the structure, throughout the thickness of the solid, according to the invention.

FIG. 3 shows variations of x throughout the thickness d expressed by a sinusoid.

Here $d_1$ is the thickness of each layer 2 (FIG. 1) of the first group of layers, whereas $d_2$ (FIG. 3) is the thickness of each layer 3 (FIG. 1) of the second group.

Throughout the thickness $d_1$ (FIG. 3) of the layer 2 (FIG. 1) x has a first mean value and the principle of x variation from one boundary of the layer 2 to the other boundary is expressed by the first halfwave of the sinusoid.

Throughout the thickness $d_2$ (FIG. 3) of the layer 3 (FIG. 1) x has a second mean value and the principle of x variation from one boundary of the layer 3 to the other is expressed by the second halfwave of the sinusoid.

Figure 4:
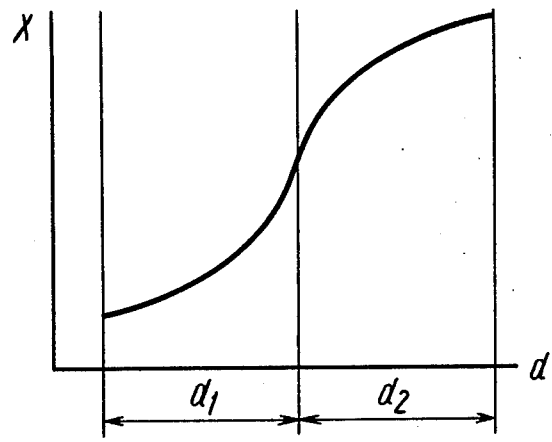
FIG. 4 shows a graph of one more principle of x variation from one layer to another layer of the structure, throughout the thickness of the solid, according to the invention.

Referring to FIG. 4, the principle of x variation throughout the thickness d is expressed by a part of a sinusoid, wherein $d_1$ is the thickness of each layer 2

(FIG. 1) of the first group and $d_2$ (FIG. 4) is the thickness of each layer 3 (FIG. 1) of the second group.

Throughout the thickness $d_1$ (FIG. 4) of the layer 2 (FIG. 1) x has a first mean value, whereas throughout the thickness $d_2$ (FIG. 4) of the layer 3 (FIG. 1) x has a second mean value. The principle of x variation from the thickness d of the layers 2 and 3 is represented by a part of a sinusoid from the minimum value of x on the first boundary of the layer 2 to the maximum value of x on the second boundary of the layer 3 of the structure.

The pressure sensing device operates as follows.

When the pressure to be measured rises, the electrical resistance of the device also rises resulting in a respective rise of the potential difference between the contacts 5 (FIG. 1) registered by the ohmmeter 4.

The pressure sensitivity S of the pressure sensing device is determined by the following general formula:

$$S = \frac{\Delta U}{U_o \cdot \Delta p} \text{ [bar}^{-1}\text{], where} \tag{1}$$

$U_o$ is the potential difference between the contacts 5 at the initial pressure;

$\Delta U$ is an increment of the potential difference between the contacts 5 caused by the pressure change;

$\Delta p$ is an increment of pressure.

The pressure sensitivity S of the pressure sensing device in case the conductivity and thickness $d_1$ and $d_2$ of the layers 2 and 3, respectively, are equal, is determined by the formula:

$$S = (S_1 + S_2)/2, \tag{2}$$

where $S_1$ is the sensitivity of the solid solution of the layer 2;

$S_2$ is the sensitivity of the solid solution of the layer 3.

Since the dependance of the solid solution pressure sensitivity upon the value of x is known, and x variations throughout the thickness $d_1$ or $d_2$ of each layer 2 or 3 are sinusoidal, $S_1$ and $S_2$ can be found by integrating this known dependance within the limits of x variations in the layers 2 and 3 of each group. In case the value "x" varies gradually through the thickness $d_1$ and $d_2$ of each layer 2 and 3, the values $d_1$ and $d_2$ are determined by integration according to the known law of dependence of "d" on "x" in the variation range of "x" in the layers 2 or 3.

The pressure sensitivity of the device based on a semiconductor solid solution composed of two semiconductor materials can either increase or decrease in response to the temperature of the environment.

This depends on the ratio between the thermal energy kT of the electron and the energy gap $\Delta E$ between the direct and indirect minimums of the conduction and of the $AB_{1-x}C_x$ solid solution. The value $\Delta E$ in its turn depends on the value of x of the solid solution.

The pressure sensitivity increases with the rise of the temperature, when the inequality $\Delta E \gg kT$ is complied with.

The pressure sensitivity falls with the rise of the temperature, when the inequality $\Delta E \ll kT$ is observed.

The composition of the layers 2 and 3 of the structure is, therefore, selected so that the composition of the layers 2 of the first group ensures the first ratio $\Delta E \gg kT$, whereas the composition of the layers 3 of the second group ensures the second condition $\Delta E \ll kT$.

Figure 5:
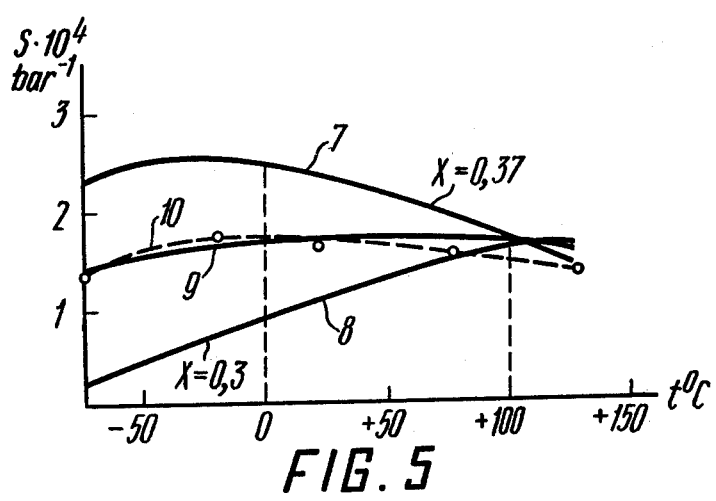
FIG. 5 shows curves of the device pressure sensitivity versus temperature, according to the invention.

If in the layers 2 (FIG. 1), wherein $x = 0.37$, within the temperature range from 0° to 100° C. the sensitivity $S_1$ decreases with the rise of the temperature, as shown in FIG. 5 by a curve 7, and in the layers 3 (FIG. 1), wherein $x = 0.3$, the sensitivity $S_2$ in the same temperature range increases, as shown in FIG. 5 by a curve 8, the total sensitivity S of the pressure sensing device is less dependent on the temperature than in each of the layers 2 and 3 (FIG. 1), as shown in FIG. 5 by a curve 9.

Thus, reduction of sensitivity to the applied pressure in the layers 2 (FIG. 1) of the first group is compensated by the increase of the sensitivity to the applied pressure in response to temperature variations in the layers 3 of the second group.

This ensures an increase of the operational temperature range and improvement of the temperature stability of the pressure sensitivity coefficient.

Besides, the pressure sensitivity of the pressure sensing device and the temperature stability depend on the doping level of the $AB_{1-x}C_x$ solid solution.

In case the doping level is low, the pressure sensitivity is determined by the possible transfer of electrons over the energy gap $\Delta E$ between the direct and indirect minimums of the conduction band.

When the doping level is raised to degeneracy of the electron gas, which for the majority of $A^{III}B^V$ compounds takes place at the concentration of free carriers higher than $10^{18}$ cm$^{-3}$, the Fermi level, which corresponds to the energy $E_F$, is transferred from the forbidden band to the conduction band and sensitivity of such a device to pressure is determined by possible transfer of electrons over the energy gap $(\Delta E - E_F)$.

Though the electron energy kT grows with the increase of the temperature, the possibility of their transfer over the energy clearance $(\Delta E - E_F)$ is almost unchanged, since the Fermi level goes down with the increase of the temperature.

This means lesser $E_F$ energy and, consequently, a greater energy clearance $(\Delta E - E_F)$, which finally results in reduced possibility of electron transfers due to temperature and better temperature sensitivity of pressure sensing devices.

Besides, in case of electron gas degeneracy both the concentration and mobility of electrons hardly change with the temperature, which also improves the temperature stability of the pressure sensing device resistance.

The ratio between thicknesses $d_1$ and $d_2$ of the neighbouring layers 2 and 3 of different groups and the total thickness d of the structure are substantial factors influencing the operation of the pressure sensing device.

The absolute value of these parameters is determined by the requirement to the input impedance of the device.

The absolute value of the thicknesses $d_1$ and $d_2$ of the layers 2 and 3 is selected taking into account the nature of a specific solid solution which is the base for the pressure sensing device.

In case the $GaAl_{1-x}P_x$ solid solution is used, and it is characterized by a significant difference of crystal lattice parameters of the semiconductor substances of gallium arsenide and gallium phosphide, the structure based on this solid solution is selected so that the layers 2 and 3 are as thin as possible in order to reduce the periodic structure mismatch dislocation density.

If a solid solution comprising gallium arsenide and aluminum arsenide, wherein the difference of lattice parameters of the semiconductor substances is close to zero, are used, thicker layers 2 and 3 can be made.

However, in any case a greater number of the total number of the layers 2 and 3 of the structure contributes to higher reproducibility of parameters of pressure sensing devices in the process of manufacture due to the statistical averaging of uncontrollable deviations of the thickness of the layers 2 and 3 from a specific thickness and deviations of the profile of the solid solution components distribution throughout the thickness of the layers 2 and 3.

For better understanding of the present invention several concrete examples of embodiments of the pressure sensing device are given below.

EXAMPLE 1

The pressure sensing device is made on the basis of the $GaAs_{1-x}P_x$ solid solution comprising alternating layers 2 and 3, which value of x are $x = 0.3$ and $x = 0.37$, respectively.

The total number of the layers 2 and 3 is 300, the thickness of the layers 2 and 3 is uniform and is equal to 500 Å, the ratio of volumes of the layers 2 and 3 of different groups is 1.

The absolute value of thickness of separate layers 2 and 3 of the $GaAs_{1-x}P_x$ solid solution is selected from a range of from 200 Å to 3,000 Å.

This range is considered optimal, since it is an experimentally established fact that, when the thickness of each layer 2 and 3 is less than 3,000Å conjugation of the crystal lattice is usually coherent that is devoid of mismatch dislocations.

The layers 2 and 3 should not be made thinner than 200Å since this involves technological difficulties owing to manufacturing of expansive high-quality periodic structures with a period less than 200 Å, which makes the pressure sensing device more expensive.

The level of doping of the layers 2 and 3 constitutes $2.10^{18}$ cm$^{-3}$.

The pressure sensing device is a solid 1 which dimensions are 10 mm by 0.2 mm by 0.015 mm. The contacts 5 are made of the indium-tin alloy, the leads 6 are gold conductors with a diameter of 50-70 microns.

The resistance variations were measured by the ohmmeter 4 within the pressure range of from 0 to 250 bars.

The range of resistance variations of the pressure sensing device was registered as being from 795 ohms to 670 ohms in the temperature range from $-77°$ C. to $+130°$ C. at a constant pressure, that is within the temperature range of 207 degrees the resistance variation reached 20% and the temperature coefficient of resistance variation is equal to 0.1% . deg$^{-1}$.

The sensitivity of the device to pressure versus the temperature is shown in FIG. 5 by the curve 10.

The pressure sensitivity changed from $1.36.10^{-4}$ bar$^{-1}$ at $-77°$ C. to $1.27.10^{-4}$ bar$^{-1}$ at $+130°$ C.

The temperature caused variation of the sensitivity within a 207 degree range amounted to 7%, whereas the temperature coefficient of sensitivity variation proved to be 0.033% . deg$^{-1}$.

The calculated curve 9 and the experimental curve 10 were close enough for this pressure sensing device.

The described pressure sensing device possesses good temperature resistance stability (the resistance variation temperature coefficient is 0.1% . deg.) and good temperature stability of the sensitivity to pressure (the sensitivity variation temperature coefficient is 0.033% . deg$^{-1}$).

The semiconductor pressure sensing device based on the $GaAs_{1-x}P_x$ solid solution can be used in compressor installations, petrochemical industry, for weighing ore in mine cars, as well as for measuring superhigh pressures (up to 40,000 bars) in laboratories.

EXAMPLE 2

The pressure sensing device is made on the basis of the $AsGa_{1-x}Al_x$ solid solution with two layers 2 and 3 (FIG. 1) where $x = 0.33$ and $x = 0.37$, respectively.

The solid 1 comprises two layers 2 and 3 which are 60,000 Å thick each, the ratio between the volumes of the layers 2 and 3 of different groups being equal to 1.

The layers 2 and 3 are doped to the level of $2.10^{18}$ cm$^{-3}$

The pressure sensing device is a solid 1 which dimensions are 10 mm by 0.2 mm by 0.012 mm.

The contacts 5 are made of nickel, whereas the leads 6 are copper conductors with a diameter of 50-55 microns.

The resistance is measured by the ohmmeter 4 within the pressure range of from 0 to 250 bars.

The variation range of the device resistance was registered as being from 155 ohms to 147 ohms at a constant pressure within the temperature range from $21°$ C. to $108°$ C., respectively.

Within this temperature range equal to 77 degrees the device resistance variation reached 5.5%, whereas the resistance variation temperature coefficient was equal to 0.07%. deg$^{-1}$.

The sensitivity to pressure varied from $2.43.10^{-4}$ bar$^{-1}$ at $21°$ C. to $2.28.10^{-4}$ bar$^{-1}$ at $108°$ C.

The temperature induced variation of sensitivity within a 77 degree range was 7%, whereas the sensitivity variation temperature coefficient was equal to 0.1% deg$^{-1}$.

The semiconductor pressure sensing device based on the $AsGa_{1-x}Al_x$ solid solution can be used for measuring the oil pressure in wells and in the process of pressing ceramic-metal parts.

What is claimed is:

1. A semiconductor pressure sensing device, essentially a semiconductive structure composed of two groups of alternating layers of an $AB_{1-x}C_x$ solid solution; the $AB_{1-x}C_x$ solid solution comprising AB and AC semiconductor materials, the first material having a direct forbidden band, and the second material having an indirect forbidden band and each of the materials having direct and indirect energy minimums of the conduction band, wherein the value of "x," is a molar fraction of the AC material in the $AB_{1-x}C_x$ solid solution and is selected so that the direct and the indirect minimum of the conduction band of the solid solution are close to each other in terms of their energies.

2. A pressure sensing solid as claimed in claim 1, in which said value of x in each said layer of said semiconductor structure is constant throughout the thickness of each said layer.

3. A pressure sensing device as claimed in claim 1, in which said value of x in each said layer of said semiconductor structure varies throughout the thickness of each said layer from its one boundary to the other.

4. A pressure sensing device as claimed in claim 1, in which said layers of said semiconductor structure are doped by a donor impurity with shallow energy levels with a concentration of free carriers sufficient for degeneracy of the electron gas in said semiconductor structure.

5. A pressure sensing device as claimed in claim 1, in which said solid is a $GaAs_{1-x}P_x$ semiconductor structure, wherein x is selected from a range of values from 0.2 to 0.4, the ratio of the total volume of said layers of the first group to the total volume of said layers of the second group is selected from a range of from 1 to 10, the thickness of each said layer is selected from a range of from 200 Å to 3,000 Å, the difference between the maximum and minimum values of said x in said structure is selected from a range of from 0.02 to 0.2.

6. A pressure sensing device as claimed in claim 5, in which said layers of said semiconductor structure are doped by a donor impurity with shallow energy levels to the concentration of free carriers sufficient for degeneracy of the electron gas in said semiconductor structure.

* * * * *